(12) United States Patent
Zhao et al.

(10) Patent No.: US 10,379,396 B2
(45) Date of Patent: Aug. 13, 2019

(54) DISPLAY PANEL AND DISPLAY DEVICE

(71) Applicants: BOE Technology Group Co., Ltd., Beijing (CN); Ordos Yuansheng Optoelectronics Co., Ltd., Inner Mongolia (CN)

(72) Inventors: Yanyan Zhao, Beijing (CN); Jingyi Xu, Beijing (CN); Fuqiang Tang, Beijing (CN); Yanwei Ren, Beijing (CN); Kunpeng Zhang, Beijing (CN); Yu Liu, Beijing (CN); Yuelin Wang, Beijing (CN)

(73) Assignees: BOE Technology Group Co, Ltd., Beijing (CN); Ordos Yuansheng Optoelectronics Co, Ltd., Inner Mongolia (CN)

( * ) Notice: Subject to any disclaimer, the term of this patent is extended or adjusted under 35 U.S.C. 154(b) by 0 days.

(21) Appl. No.: 15/718,711

(22) Filed: Sep. 28, 2017

(65) Prior Publication Data
US 2018/0203288 A1    Jul. 19, 2018

(30) Foreign Application Priority Data
Jan. 16, 2017  (CN) ..................... 2017 2 0055827 U

(51) Int. Cl.
*H01L 23/60*    (2006.01)
*H01L 27/02*    (2006.01)
(Continued)

(52) U.S. Cl.
CPC ........ *G02F 1/133512* (2013.01); *H01L 23/60* (2013.01); *H01L 27/0292* (2013.01);
(Continued)

(58) Field of Classification Search
CPC ........... G02F 1/133512; G02F 2202/28; G02F 2203/69; G02F 1/133514; G02F 2202/22;
(Continued)

(56) References Cited

U.S. PATENT DOCUMENTS

2014/0125908 A1* 5/2014 Hong ................ G02F 1/136209
                                                          349/44
2016/0327841 A1* 11/2016 Jia ........................ G02F 1/1345
(Continued)

*Primary Examiner* — Julia Slutsker
(74) *Attorney, Agent, or Firm* — Arent Fox LLP; Michael Fainberg

(57) ABSTRACT

The present disclosure discloses a display panel and a display device. The display panel includes an array substrate and an opposite substrate arranged opposite to each other; the array substrate includes a box alignment area facing the opposite substrate, a circuit test area located on a side of the box alignment area; the opposite substrate includes a base substrate, a conductive black matrix arranged on a side of the base substrate facing the array substrate; the display panel further includes an electrostatic discharging layer electrically connected respectively with the conductive black matrix and a GND wire in the circuit test area; the conductive black matrix is provided with a thickened area in at least an area in contact with the electrostatic discharging layer; a thickness of the thickened area of the conductive black matrix is more than a thickness of other areas of the conductive black matrix.

18 Claims, 2 Drawing Sheets

(51) Int. Cl.
  *H01L 27/12* (2006.01)
  *G02F 1/1335* (2006.01)
(52) U.S. Cl.
  CPC .... *H01L 27/1214* (2013.01); *G02F 1/133514* (2013.01); *G02F 2202/22* (2013.01); *G02F 2202/28* (2013.01); *G02F 2203/69* (2013.01)
(58) Field of Classification Search
  CPC .. H01L 23/60; H01L 27/0292; H01L 27/1214
  See application file for complete search history.

(56) References Cited

U.S. PATENT DOCUMENTS

2016/0337625 A1* 11/2016 Nakamura ........... H04N 9/3108
2016/0351092 A1* 12/2016 Chen ................... G09G 3/3233

* cited by examiner

DISPLAY PANEL AND DISPLAY DEVICE

This Application claims priority to Chinese Patent Application No. 201720055827.1, filed on Jan. 16, 2017, the content of which is incorporated by reference in the entirety.

FIELD

The present disclosure relates to the field of display technologies, and particularly to a display panel and a display device.

BACKGROUND

The anti-electrostatic performance of a liquid crystal display panel is an important index to evaluate the quality of the display panel, and if the anti-electrostatic performance of the display panel is improved, then the performance of the panel may be improved to thereby pass a reliability test on a client.

Therefore, how to improve the anti-electrostatic performance of the display panel becomes an urgent technical problem to be solved in this field.

SUMMARY

An object of embodiments of the disclosure is to provide a display panel and a display device so as to improve an effect of electrostatic discharging, and improve the anti-electrostatic performance of the display panel.

In one aspect, the present disclosure provides a display panel, which includes an array substrate and an opposite substrate arranged opposite to each other, wherein the array substrate includes a box alignment area facing the opposite substrate, and a circuit test area located on a side of the box alignment area; the opposite substrate includes a base substrate, and a conductive black matrix arranged on a side of the base substrate facing the array substrate; the display panel further includes an electrostatic discharging layer electrically connected respectively with the conductive black matrix, and a ground (GND) wire in the circuit test area; and the conductive black matrix is provided with a thickened area in at least an area in contact with the electrostatic discharging layer; and a thickness of the thickened area of the conductive black matrix is more than a thickness of other areas of the conductive black matrix.

In another aspect, the present disclosure provides a display device, which includes a display panel, the display panel includes an array substrate and an opposite substrate arranged opposite to each other, wherein the array substrate includes a box alignment area facing the opposite substrate, and a circuit test area located on a side of the box alignment area; the opposite substrate includes a base substrate, and a conductive black matrix arranged on a side of the base substrate facing the array substrate; the display panel further includes an electrostatic discharging layer electrically connected respectively with the conductive black matrix, and a GND wire in the circuit test area; and the conductive black matrix is provided with a thickened area in at least an area in contact with the electrostatic discharging layer; and a thickness of the thickened area of the conductive black matrix is more than a thickness of other areas of the conductive black matrix.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

It shall be appreciated that the following descriptions of some embodiments presented herein are merely intended to illustrate and describe, but not to limit the disclosure.

Figure 1:
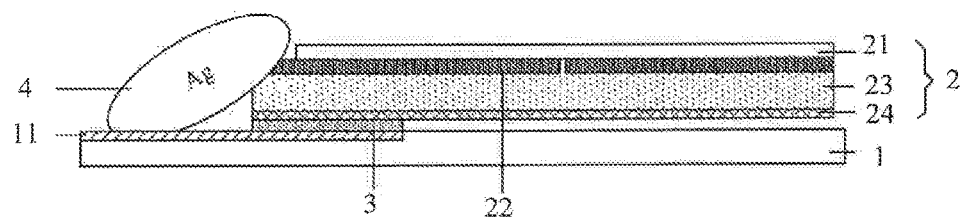
FIG. 1 is a schematic structural diagram of a display panel in the related art.

As illustrated in FIG. 1, a display panel in the related art includes an array substrate 1 and a color filter substrate 2 arranged opposite to each other, where the array substrate 1 includes a box alignment area opposite to the color filter substrate 2, and a circuit test area located on a side of the box alignment area. The box is aligned in such a way that the array substrate 1 and the color filter substrate 2 are encapsulated in the border area using frame sealant 3. Here the color filter substrate 2 includes a glass substrate 21, and a conductive black matrix 22, a planar layer 23, and a liquid crystal orientation layer 24 are arranged on a side of the glass substrate 21 facing the array substrate 1 in that order. In order to improve the anti-electrostatic performance of the display panel, an edge of the conductive black matrix 22 is arranged protruding outward, that is, protruding from the glass substrate 21, where the edge of the conductive black matrix 22, which is protruding outward, comes into contact with an Ag glue drop (i.e. dot-shaped Ag glue) 4 connected with the circuit test area so that electrostatic charges in the panel can be released over a GND wire in the circuit test area (a source lead 11 as illustrated in FIG. 1). However since the edge of the conductive black matrix 22 protrudes outward only to some extent, the edge thereof may not come into full contact with the Ag glue drop 4, thus discouraging an effect of electrostatic discharging.

In order to improve an effect of electrostatic discharging, embodiments of the disclosure provide a display panel and a display device. A display panel according to an embodiment of the disclosure includes an array substrate and an opposite substrate arranged opposite to each other, where the array substrate includes a box alignment area facing the opposite substrate, and a circuit test area located on a side of the box alignment area; the opposite substrate includes a base substrate, and a conductive black matrix arranged on a side of the base substrate facing the array substrate; the display panel further includes an electrostatic discharging layer electrically connected respectively with the conductive black matrix, and a GND wire in the circuit test area; the conductive black matrix is provided with a thickened area in at least an area in contact with the electrostatic discharging layer; and a thickness of the thickened area of the conductive black matrix is more than a thickness of other areas of the conductive black matrix (also called non-thickened area).

Here the circuit test area is primarily an area in which a Cell Test circuit is arranged.

In the embodiment of the disclosure, the conductive black matrix is arranged with the thickened area, so that on one hand, the thickened area comes into contact with the electrostatic discharging layer to thereby increase the contact area between them so as to lower the resistance, thus speeding up the movement of the charges, improving the effect of electrostatic discharging, and improving the anti-electrostatic capacity; and on the other hand, the thickness of the conductive black matrix itself is increased, and the resistance thereof is lowered, thus facilitating electrostatic discharging, and improving the anti-electrostatic capacity.

The solution according to the disclosure will be described below in further details with reference to the drawings and the embodiments thereof.

Figure 2:
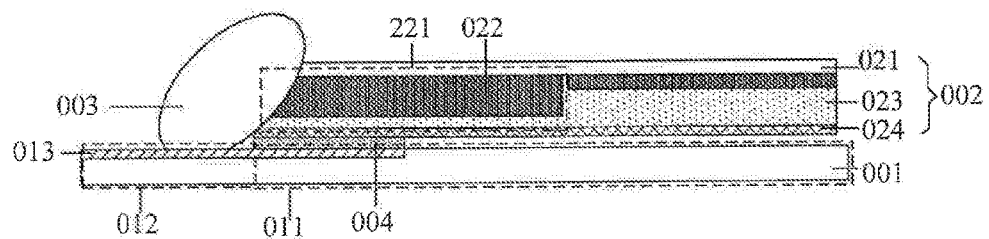
FIG. 2 is a first schematic structural diagram of a display panel according to an embodiment of the disclosure.

As illustrated in FIG. 2, a display panel according to an embodiment of the disclosure includes an array substrate 001 and an opposite substrate 002 arranged opposite to each other, where the array substrate 001 includes a box alignment area 011 facing the opposite substrate 002, and a circuit test area 012 located on a side of the box alignment area 011; the opposite substrate 002 includes a base substrate 021, and a conductive black matrix 022 arranged on a side of the base substrate 021 facing the array substrate 001; the display panel further includes an electrostatic discharging layer 003 electrically connected respectively with the conductive black matrix 022, and a GND wire 013 in the circuit test area 012; the conductive black matrix 022 is provided with a thickened area 221 in at least an area in contact with the electrostatic discharging layer 003; and a thickness of the thickened area 221 of the conductive black matrix 022 is more than a thickness of other areas of the conductive black matrix 022.

As can be apparent from FIG. 2, the contact area between the conductive black matrix 022 and the electrostatic discharging layer 003 is thicker, and as compared with the display panel illustrated in FIG. 1, the contact area is increased, the resistance is lowered, the movement of charges is speed up, the effect of electrostatic discharging is improved, and thus the anti-electrostatic capacity is improved.

In some embodiments, as illustrated in FIG. 2, the array substrate 001 and the opposite substrate 002 are encapsulated at an edge of the box alignment area 011 using frame sealant 004.

Figure 3:
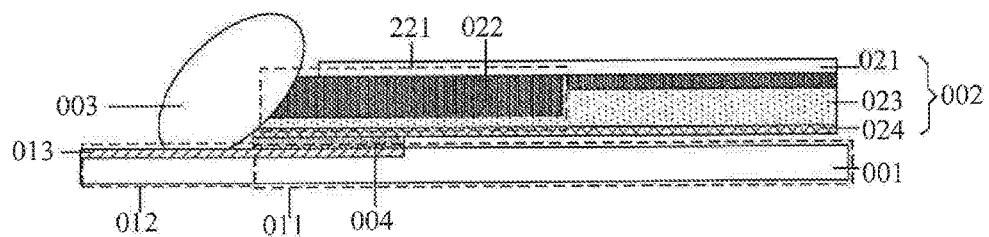
FIG. 3 is a second schematic structural diagram of a display panel according to an embodiment of the disclosure.

In some embodiments, as illustrated in FIG. 3, the thickened area 221 of the conductive black matrix 022 protrudes from the base substrate 021 on a side, proximate to the circuit test area 012, of the conductive black matrix 022. In this embodiment, the side, proximate to the circuit test area 012, of the conductive black matrix 022 is a side thereof in contact with the electrostatic discharging layer 003, and the edge of the conductive black matrix 022 in contact with the electrostatic discharging layer 003 on that side is arranged protruding from the base substrate 021, that is, protruding outward, so that the exposed area of the conductive black matrix is increased to thereby increase the contact area between the electrostatic discharging layer and the conductive black matrix so as to further improve the effect of electrostatic discharging.

Figure 4:
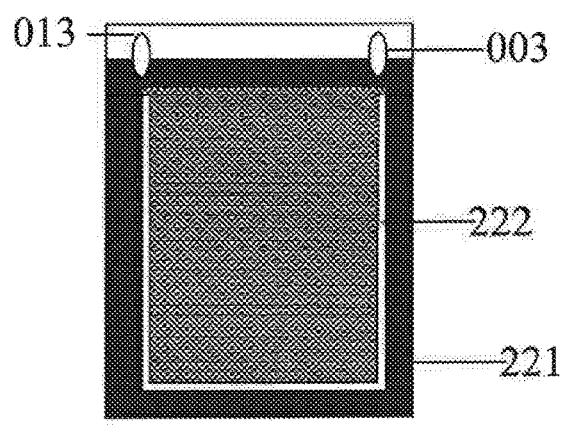
FIG. 4 is a third schematic structural diagram of a display panel according to an embodiment of the disclosure.

In some embodiments, as illustrated in FIG. 4, the conductive black matrix 022 is provided with a trench 222 on the other sides thereof away from the circuit test area 012 to prevent external electrostatic charges; and the trench 222 is surrounded by the thickened area 221 of the conductive black matrix 022 (illustrated as the area in a darker color in FIG. 4). In this embodiment, the trench can be arranged to prevent external electrostatic charges from entering the display panel, so as to further improve the anti-electrostatic performance, and the edges of the conductive black matrix on all the sides thereof can be thickened to thereby lower the resistance so as to improve the effect of electrostatic discharging, and further improve the anti-electrostatic performance.

Figure 5:
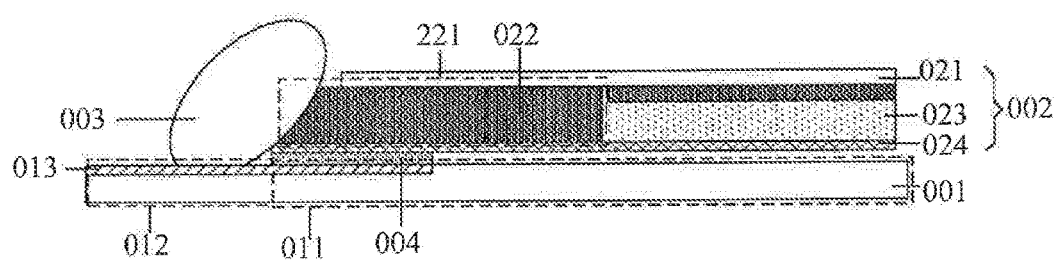
FIG. 5 is a fourth schematic structural diagram of a display panel according to an embodiment of the disclosure.

In some embodiments, in the display panel as illustrated in FIG. 2 and FIG. 3, the opposite substrate 002 further includes a planar layer 023 stacked with the conductive black matrix 022. In order to further improve the effect of electrostatic discharging, In some embodiments as illustrated in FIG. 5, the planar layer 023 is stacked only with an area of the conductive black matrix 022 surrounded by the trench 222; and the thickness of the thickened area 221 of the conductive black matrix 022 is equal to the sum of a thickness of the area of the conductive black matrix 022 surrounded by the trench 222, and a thickness of the planar layer 023. In this embodiment, the planar layer is replaced by the conductive black matrix at the other edges than the trench to thereby further increase the thickness of the conductive black matrix so as to lower resistance of the conductive black matrix, thus improving the effect of electrostatic discharging.

In some embodiments, the thickness of the thickened area 221 of the conductive black matrix 022 can be arranged as needed in practice for better effect of electrostatic discharging. For example, the thickness of the thickened area 221 of the conductive black matrix 022 can range from 1.8 µm to 2.2 µm.

In some embodiments, there are a number of materials for the electrostatic discharging layer 003, for example, the electrostatic discharging layer 003 can be made of conductive glue but will not be limited thereto.

In some embodiments, the conductive glue can be an Ag glue drop but will not be limited thereto.

In some embodiments, the disclosure can be applied to a liquid crystal display panel, the opposite substrate 002 can be a color filter substrate, and as illustrated in FIG. 2, FIG. 3, and FIG. 5, the opposite substrate 002 further includes a liquid crystal orientation layer 024 thereon.

In some embodiments, the GND wire 013 in the circuit test area 012 is a source lead.

In some embodiments, in a process for preparing the conductive black matrix arranged with the thickened area, the conductive black matrix arranged with the thickened area can be prepared using a half tone mask, for example, in a particular process: coating the material of the conductive black matrix on the entire base substrate, and then coating photo-resist thereon; exposing the photo-resist using a half tone mask to form an area to be reserved totally, corresponding to the thickened area, in the area of the photo-resist layer, an area to be reserved partially corresponding to the other parts of the photo-resist layer to be shielded, and an area to be removed totally in the other parts of the photo-resist layer; etching the conductive black matrix according to the area to be removed totally; ashing the photo-resist to remove all the photo-resist in the area to be reserved partially, and remove a part of the photo-resist in the area to be reserved totally; and etching the conductive black matrix to thin the conductive black matrix in the area to be reserved partially.

Based upon the same inventive idea, an embodiment of the disclosure further provides a display device including the display panel according to any one of the embodiments above.

In the display panel and display device as illustrated in the embodiments of the disclosure, the conductive black matrix is arranged with the thickened area, so that on one hand, the thickened area comes into contact with the electrostatic discharging layer to thereby increase the contact area between them so as to lower the resistance, thus speeding up the movement of the charges, improving the effect of electrostatic discharging, and improving the anti-electrostatic capacity; and on the other hand, the thickness of the conductive black matrix itself is increased, and the resistance thereof is lowered, thus facilitating electrostatic discharging, and improving the anti-electrostatic capacity.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A display panel, comprising: an array substrate and an opposite substrate arranged opposite to each other, wherein the array substrate comprises a box alignment area facing the opposite substrate, and a circuit test area located on a side of the box alignment area; the opposite substrate comprises a base substrate, and a conductive black matrix arranged on a side of the base substrate facing the array substrate; the display panel further comprises an electrostatic discharging layer electrically connected respectively with the conductive black matrix, and a ground (GND) wire in the circuit test area; and the conductive black matrix has an area in contact with the electrostatic discharging layer, and is provided with a thickened area in at least the area in contact with the electrostatic discharging layer; and a thickness of the thickened area of the conductive black matrix is greater than a thickness of other areas of the conductive black matrix.

2. The display panel according to claim 1, wherein the thickened area of the conductive black matrix protrudes from the base substrate on a side, proximate to the circuit test area, of the conductive black matrix.

3. The display panel according to claim 2, wherein the conductive black matrix is provided with a trench on other sides thereof away from the circuit test area to prevent external electrostatic charges; and the trench is surrounded by the thickened area of the conductive black matrix.

4. The display panel according to claim 3, wherein the opposite substrate further comprises a planar layer stacked with the conductive black matrix.

5. The display panel according to claim 4, wherein the planar layer is stacked only with an area of the conductive black matrix surrounded by the trench; and the thickness of the thickened area of the conductive black matrix is equal to a sum of a thickness of the area of the conductive black matrix surrounded by the trench, and a thickness of the planar layer.

6. The display panel according to claim 1, wherein the thickness of the thickened area of the conductive black matrix ranges from 1.8 μm to 2.2 μm.

7. The display panel according to claim 1, wherein the electrostatic discharging layer is made of conductive glue.

8. The display panel according to claim 7, wherein the conductive glue is an Ag glue drop.

9. The display panel according to claim 1, wherein the opposite substrate is a color filter substrate.

10. A display device, comprising a display panel, wherein the display panel comprising: an array substrate and an opposite substrate arranged opposite to each other, wherein the array substrate comprises a box alignment area facing the opposite substrate, and a circuit test area located on a side of the box alignment area; the opposite substrate comprises a base substrate, and a conductive black matrix arranged on a side of the base substrate facing the array substrate; the display panel further comprises an electrostatic discharging layer electrically connected respectively with the conductive black matrix, and a ground (GND) wire in the circuit test area; and the conductive black matrix has an area in contact with the electrostatic discharging layer, and is provided with a thickened area in at least the area in contact with the electrostatic discharging layer; and a thickness of the thickened area of the conductive black matrix is greater than a thickness of other areas of the conductive black matrix.

11. The display device according to claim 10, wherein the thickened area of the conductive black matrix protrudes from the base substrate on a side, proximate to the circuit test area, of the conductive black matrix.

12. The display device according to claim 11, wherein the conductive black matrix is provided with a trench on other sides thereof away from the circuit test area to prevent external electrostatic charges; and the trench is surrounded by the thickened area of the conductive black matrix.

13. The display device according to claim 12, wherein the opposite substrate further comprises a planar layer stacked with the conductive black matrix.

14. The display device according to claim 13, wherein the planar layer is stacked only with an area of the conductive black matrix surrounded by the trench; and the thickness of the thickened area of the conductive black matrix is equal to a sum of a thickness of the area of the conductive black matrix surrounded by the trench, and a thickness of the planar layer.

15. The display device according to claim 10, wherein the thickness of the thickened area of the conductive black matrix ranges from 1.8 μm to 2.28 μm.

16. The display device according to claim 10, wherein the electrostatic discharging layer is made of conductive glue.

17. The display device according to claim 16, wherein the conductive glue is an Ag glue drop.

18. The display device according to claim 10, wherein the opposite substrate is a color filter substrate.

* * * * *